United States Patent
Suzuki et al.

(10) Patent No.: US 7,445,688 B2
(45) Date of Patent: Nov. 4, 2008

(54) METHOD AND APPARATUS FOR PICKING UP WORK PIECE AND MOUNTING MACHINE

(75) Inventors: Hidetoshi Suzuki, Tokyo (JP); Osamu Shindo, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/846,506

(22) Filed: May 17, 2004

(65) Prior Publication Data

US 2005/0006029 A1 Jan. 13, 2005

(30) Foreign Application Priority Data

Jul. 9, 2003 (JP) .............................. 2003-272379

(51) Int. Cl.
*B32B 38/10* (2006.01)
(52) U.S. Cl. ..................... 156/344; 156/584; 438/464; 438/976
(58) Field of Classification Search ................. 156/344, 156/584; 438/464, 976
See application file for complete search history.

(56) References Cited

U.S. PATENT DOCUMENTS

| | | | | |
|---|---|---|---|---|
| 5,411,921 | A * | 5/1995 | Negoro | 438/118 |
| 6,123,800 | A * | 9/2000 | Freund et al. | 156/344 |
| 6,204,092 | B1 * | 3/2001 | Freund et al. | 438/113 |
| 2003/0049110 | A1 * | 3/2003 | Suzuki et al. | 414/403 |
| 2004/0115904 | A1 * | 6/2004 | Cheung et al. | 438/464 |

FOREIGN PATENT DOCUMENTS

| | | | | |
|---|---|---|---|---|
| JP | 61-027239 | | 2/1986 | |
| JP | 62098638 A | * | 5/1987 | |
| JP | 62-128139 | * | 6/1987 | ................ 156/584 |
| JP | 63-29946 | * | 2/1988 | ................ 156/344 |
| JP | 1-134944 | * | 5/1989 | |
| JP | 1-321650 | | 12/1989 | |
| JP | 02163944 A | * | 6/1990 | |
| JP | 05-036817 | | 2/1993 | |
| JP | 2000-12570 | | 1/2000 | |
| JP | 2000323504 A | * | 11/2000 | |
| JP | 2001-176891 | | 6/2001 | |
| JP | 2002-50670 | | 2/2002 | |
| JP | 2003-264203 | | 9/2003 | |

* cited by examiner

*Primary Examiner*—Mark A Osele
(74) *Attorney, Agent, or Firm*—Oblon, Spivak, McClelland, Maier & Neustadt, P.C.

(57) ABSTRACT

A work piece pickup method is for sucking and holding a work piece attached on an adhesive sheet by means of a suction collet that is disposed above the work piece attached on the adhesive sheet in such a way as to be movable up and down for sucking and holding the work piece and a suction member that is disposed below the adhesive sheet in such a way as to be movable up and down so as to detach and transfer the work piece. The method comprises a sheet suction process for sucking and holding a lower surface of the adhesive sheet corresponding to the work piece by the suction member, and a work piece suction process for sucking and holding the work piece by the suction collet under a state in which the suction collet and the work piece are in a positional relationship spaced from each other so as to detach the work piece. A pickup apparatus and a mounting machine operate in accordance with the above method.

13 Claims, 5 Drawing Sheets

METHOD AND APPARATUS FOR PICKING UP WORK PIECE AND MOUNTING MACHINE

BACKGROUND OF THE INVENTION

1. Field of the Invention

The present invention relates to a mounting machine for semiconductor chips or the like. More particularly, the present invention relates to a method and apparatus for detaching a work piece having a small thickness, such as a semiconductor chip or the like, that has been diced and attached on an adhesive sheet from the adhesive sheet, and a mounting machine for mounting it on a printed circuit board or the like.

2. Related Background Art

Upon mounting semiconductor chips or the like, a pickup apparatus for transferring a plurality of work pieces such as semiconductor chips that have been separated by a dicing process on an adhesive sheet and picking up an adhering work piece has been conventionally used.

FIG. 11 is a front view showing an prior art chip pickup apparatus. The pickup apparatus 101 is composed of a suction collet 107 disposed above an adhesive sheet 111 on which work pieces 109 are attached and a push-up mechanism 113 disposed below the adhesive sheet 111. The push-up mechanism 113 is provided with a push-up pin holder 114 that can be moved up and down (in the Z direction indicated by a double-sided arrow). One end portion of the push-up pin holder 114 is connected with a driving mechanism and the other end portion is connected with a push-up pin 115. The push-up pin 115 is moved up and down by up and down movement of the push-up pin holder 114 caused by the driving mechanism.

In the above structure, the suction collet 107 is moved to a position at which it is in contact with the upper surface of a work piece 109 to be picked up. Then, the push-up pin 115 is moved upward by the push-up mechanism 113 so that the push-up pin 115 will be brought into contact with the lower surface of the work piece 109. After that, the work piece 109 is sucked by the suction collet 107.

Then, the push-up pin 115 and the suction collet 107 are moved upward at the same speed simultaneously (in the Z direction indicated by the double-sided arrow) in synchronization with each other while controlled by a control circuit, so that the work piece 109 is picked up while being held between the push-up pin 115 and the suction collet 107 (see, for example, paragraphs [0012] to [0013] or FIGS. 1 to 3 of Japanese Patent Application Laid-Open No. 2001-176891).

The above-described prior art apparatus has only one push-up pin, and there is the risk that a work piece 109 can be chipped or broken due to concentration of load exerted on the work piece 109. In view of this, a different prior art apparatus has a push-up member composed of a plurality of pins (see, for example, paragraphs [0013] to [0014], [0068] to [0069] or FIGS. 3 to 4 of Japanese Patent Application Laid-Open No. 2002-50670).

As described above, the prior art pickup apparatus is constructed in such a way that a work piece attached on the adhesive sheet is held between the cooperating push-up pin and the suction collet and detached from the adhesive sheet by upward movement of the pin and the collet. In this structure, if there is a difference in timing of the movement between the pin and the collet, an excessive load is applied to the work piece and the work piece can be chipped or broken. In addition, it is necessary in this prior art apparatus that the operation of the suction collet and the operation of the push-up pin be synchronized. Therefore, the structure of the pickup apparatus is generally complicated.

SUMMARY OF THE INVENTION

In view of the above, an object of the present invention is to provide a pickup method, a pickup apparatus and a mounting machine with which a work piece can be detached from an adhesive sheet and held without application of an excessive load to the work piece.

A first mode of the work piece pick apparatus according to the present invention that is intended to achieve the above object is a pickup apparatus for detaching a work piece attached on an adhesive sheet from said adhesive sheet and transferring it, comprising a suction collet disposed above said work piece for sucking and holding said work piece, said suction collet being movable up and down, and a suction member disposed below said adhesive sheet for sucking and holding said adhesive sheet, said suction member being movable up and down, wherein said suction member sucks to hold a lower surface of the adhesive sheet and said suction collet sucks to hold said work piece under a state in which said suction collet and said work piece are in a positional relationship spaced from each other so as to detach said work piece from said adhesive sheet.

In a second mode of the pickup apparatus according the present invention, said suction member is provided with push-up means for supporting said work piece with said adhesive sheet between and that is movable up and down independently from said suction member, and said suction collet sucks to hold said work piece under a state in which said work piece is supported by said push-up means and said suction member is at a position lower than the push-up means so as to detach said work piece from said adhesive sheet.

In a third mode of the pickup apparatus according to the present invention, an area of said push-up means by which said work piece is pressed with said adhesive sheet between is of a linear shape, and a suction hole of said suction collet is provided at a position corresponding to said area or a linear area extrapolating said area.

A fourth mode of the pickup apparatus according to the present invention is a pickup apparatus for detaching a work piece attached on an adhesive sheet from said adhesive sheet and transferring it, comprising a suction collet disposed above said work piece for sucking and holding said work piece, said suction collet being movable up and down, and a suction member disposed below said adhesive sheet for sucking and holding said adhesive sheet, said suction member being movable up and down, wherein push-up means that can be moved up and down independently from said suction member is received in said suction member, and said suction collet sucks to hold said work piece under a state in which said work piece is supported by said push-up means by a linear area with said adhesive sheet between so as to detach said work piece from said adhesive sheet.

One mode of the mounting machine according to the present invention that is intended to achieve the above object is a mounting machine comprising a pickup apparatus according to any one of the first to fourth pickup apparatus, and a mounting apparatus for mounting the work piece detached by the pickup apparatus on an object for mounting.

A first mode of the pickup method according to the present invention is a pickup method for sucking and holding a work piece attached on an adhesive sheet by means of a suction collet that is disposed above said work piece attached on said adhesive sheet in such a way as to be movable up and down for sucking and holding said work piece and a suction member that is disposed below said adhesive sheet in such a way as to be movable up and down so as to detach and transfer said work piece, comprising a sheet suction process for sucking and holding a lower surface of said adhesive sheet corresponding to said work piece by said suction member, and a work piece suction process for sucking and holding said work piece by said suction collet under a state in which said suction collet and said work piece are in a positional relationship spaced from each other so as to detach said work piece.

In a second mode of the pickup method according to the present invention, said suction member is provided with push-up means for supporting said work piece with said adhesive sheet between and that is movable up and down independently from said suction member, and said suction process is carried out under a state in which said work piece is supported by said push-up means and said suction member is at a position lower than the push-up means.

In connection with this, the state in which the suction member is at a position lower than the push-up means refers to the state in which the tip end of the push-up means is above the suction surface that constitutes the upper top surface of the suction member with respect to the axial direction.

A third mode of the pickup method according to the present invention is a work piece pickup method for sucking and holding a work piece attached on an adhesive sheet by means of a suction collet that is disposed above said work piece attached on said adhesive sheet in such a way as to be movable up and down for sucking and holding said work piece, a suction member that is disposed below said adhesive sheet in such a way as to be movable up and down and push-up means that can be moved up and down independently from said suction member received in said suction member so as to detach and transfer said work piece, comprising:

a sheet suction process for sucking and holding a lower surface of said adhesive sheet corresponding to said work piece by said suction member; and a work piece suction process for sucking and holding said work piece by said suction collet under a state in which said work piece is supported by said push-up means by a linear area with said adhesive sheet between so as to detach said work piece.

Since the above-described pickup apparatus, mounting machine and pickup method adopt such a structure in which a work piece is sucked to be held at a position in which the suction collet is spaced from the work piece, it is not necessary to hold the work between the suction collet and the push-up pin. Therefore, it is possible to prevent an excessive load from being applied to the work piece itself.

An area of a work piece pressed through an adhesive sheet by the push-up pin is of a linear shape. A suction hole of the suction collet is positioned vertically upward from the area. Therefore, even if the work piece is not horizontally held, a distance between a sucked area of work piece and the suction hole can be always made constant. Accordingly, a suction force applied to the work piece can be made constant.

Furthermore, since the area of the work piece that is pressed by the push-up pin according to the present invention is a linear area, a load per unit area applied to the work piece can be made small as compared to the case in which a pin with an aculeate tip end or a spherical tip end that presses one point on the work piece. In addition, in the case of a push-up apparatus provided with a plurality of pins in order to reduce a load applied to the work piece, it is necessary to control the operation of each of the pins. In contrast, in the present invention, it is only necessary to control a single push-up pin having a linear tip end portion.

In the pickup apparatus of the mounting machine according to the present invention, the suction collet sucks to hold a work piece under the state in which there is a gap between the suction collet and the work piece so as to detach the work piece from the adhesive sheet. Therefore, it is possible to provide a method, an apparatus and a mounting machine that will not apply an excessive load upon picking up the work piece.

In the method in which the work piece is moved upward under the state in which the work piece is held between the suction collet and the push-up pin, a complex control circuit is required for synchronizing the moving-up operation of the suction collet and the push-up pin to keep the holding force applied on the work piece constant. With the present invention, it is possible to realize a pickup method, a pickup apparatus and a mounting machine that can pick up a work piece reliably with a simple structure.

Thanks to the linear shape of the area on the work piece that is pressed by the push-up pin, a load per unit area applied to the work piece can be reduced. Therefore, it is possible to realize a pickup method, a pickup apparatus and a mounting machine with which breakage of the work piece can be avoided.

Furthermore, since the push-up pin used in the pickup method, the pickup apparatus and the mounting machine according to the present invention is a single member having a linear tip end portion, it is possible to make the manufacturing process of that member simply and to make the control process of the positioning operation of the pin easy, as compared to conventional push-up apparatus provided with a plurality of pins in order to reduce the load applied to the work piece.

DESCRIPTION OF THE PREFERRED EMBODIMENTS

In the following, the best mode of the mounting machine according to the present invention will be described with reference to the accompanying drawings.

Figure 1:
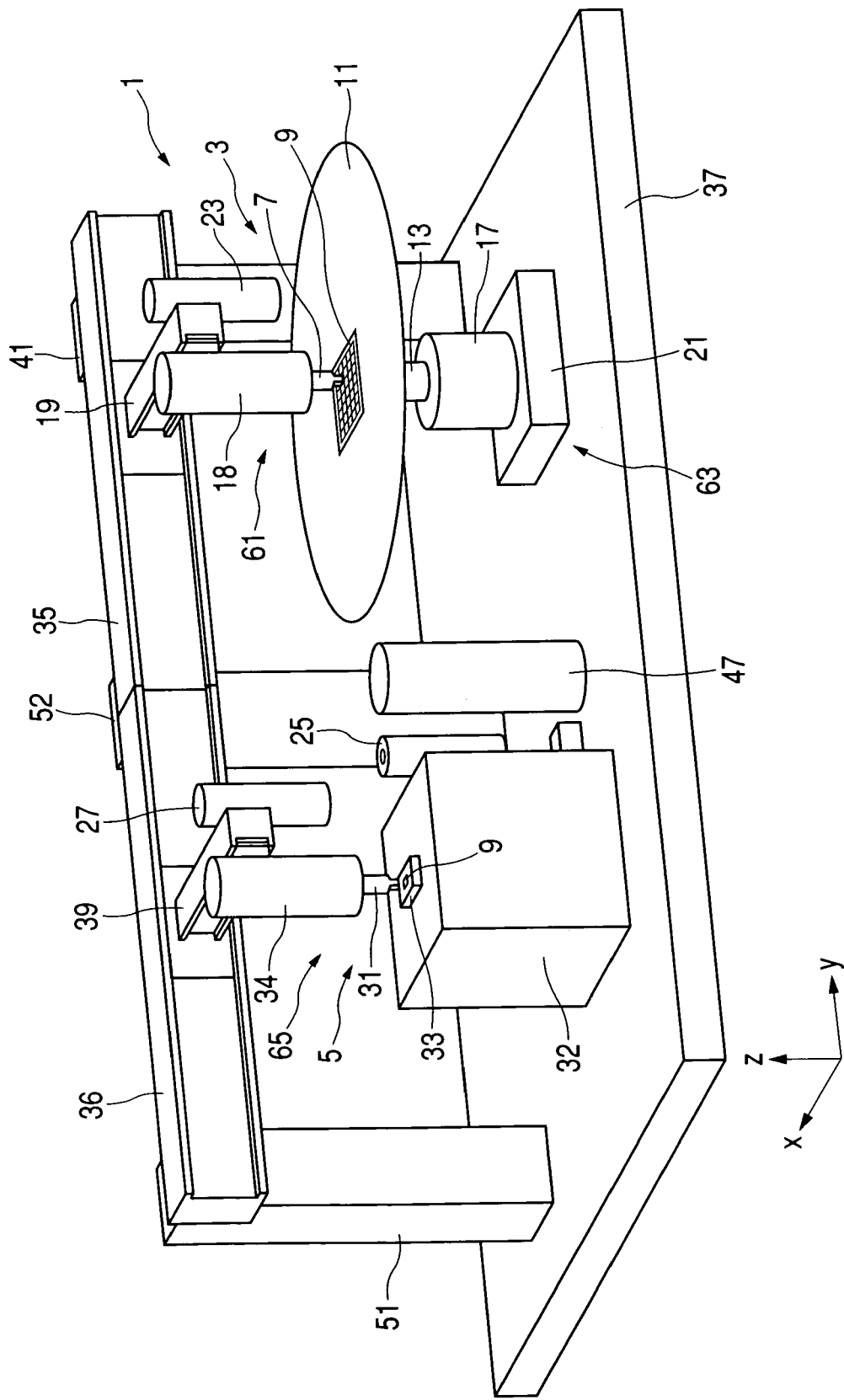
FIG. 1 is a perspective view showing a mounting machine according to the present invention.

FIG. 1 is a perspective view showing a mounting apparatus 1. The mounting machine 1 is composed of a pickup apparatus 3 for detaching a work piece 9 such as a semiconductor chip from an adhesive sheet 11 and transferring it and a mounting apparatus 5 for mounting the work piece 9 on a member for mounting such as a printed circuit board 33.

The pickup apparatus 3 is disposed in the upstream side (i.e. in the right side in FIG. 1) on the base 37 of the mounting machine 1, while the mounting apparatus 5 is disposed in the downstream side (i.e. in the left side in FIG. 1) on the base 37. In addition, a temporal placement stage 47 on which the work piece is to be temporarily placed to allow transfer from the pickup apparatus 3 to the mounting apparatus 5 is provided on the base 37 at a position between the pickup apparatus 3 and the mounting apparatus 5.

In addition, two linear guide rails 35 and 36 are provided along the longitudinal direction of the base 37 (i.e. along the y direction) to allow movement of a suction collet 7 and a suction collet for mounting 31 along the y direction. The end portions of one linear guide rail 35 are fixed to support posts 41 and 52 that stand vertically on the base 37 respectively. The end portions of the other guide rail 36 are fixed to a support post 51 and the support post 52 that stand vertically on the base 37 respectively. A pickup unit 61 and a pickup unit for mounting 65 are adapted to be driven independently from each other by means of the linear guide rails 35 and 36.

The pickup apparatus 3 is composed of the pickup unit 61 disposed above an adhesive sheet 11 that is set on an annular jig (not shown) such as a wafer ring and a work piece push-up unit 63 disposed below the adhesive sheet 11. The pickup unit 61 and the work piece push-up unit 63 are in an opposed relationship to the adhesive sheet 11.

In the following, the pickup unit 61 will be described. There is an arm member 19 that extends in the x direction. One end of the arm member 19 is mounted on the linear guide rail 35 in such a way as to be slid able on the linear guide rail 35. The arm member 19 has a guide groove extending along its longitudinal direction (i.e. along the x direction). In addition, there is a collet holder 18 that extends in the direction perpendicular to the longitudinal direction of the arm member 19 (i.e. in the z direction). The collet holder 18 extending in the z direction is mounted in such a way as to be slid able along the guide groove of the arm member 19. On the lower portion of the collet holder 18, there is mounted a suction collet 7 that is coaxial with the collet holder 18 and that can be moved up and down (in the z direction). In addition, on the side of the arm member 19 that is opposite to the guide groove, there is mounted a camera 23 for taking image information of a work piece.

In the above-described structure of the pickup unit 61, the position of the work piece 9 is detected by the camera 23, the arm portion 19 is moved in the y direction along the linear guide rail 35, the collet holder 18 is moved in the x direction along the arm member 19, and the suction collet 7 is lowered (in the z direction) to a predetermined position.

The work piece push-up unit 63 disposed below the adhesive sheet 11 is composed of a suction member 13 movable in the up and down direction (i.e. the z direction) for sucking the adhesive sheet 11 from the backside (i.e. the non-adhesive surface), a suction member body 17 for holding and moving the suction member 13 up and down, and a suction member base 21 disposed on the base 37 for supporting the suction member body 17. The suction member base 37 is movable in the x and y directions. The work piece push-up unit 63 contains a push-up pin 15 (shown in FIG. 4) received inside the suction member 13. The pushing-pin 15 will be described later. In the above-described structure, the suction member 13 is moved to a position on the backside of the adhesive sheet 11 that corresponds to a predetermined work piece 9 to suck the adhesive sheet 11. Then, the push-up pin 15 is moved upward to push the work piece 9 up at predetermined timing.

The mounting apparatus 5 disposed downstream side of the base 37 is composed of a pickup unit for mounting 65 and a stage for mounting 32. The structure of the pickup unit for mounting 65 is substantially the same as the above-described pickup unit 61, and therefore the detailed description thereof will be omitted. The pickup unit for mounting 65 is provided with an arm member 39 slid ably mounted on the linear guide 35, a collet holder 34 slid ably mounted on the arm member 39 and a suction collet for mounting 31 that is held by the collet holder 34 and that can be moved up and down. In addition, a camera 27 for taking image information of the work piece is mounted on the arm member 39.

The stage for mounting 32 is mounted on the base 37 in such a way as to be movable in the x and y directions. On the side surface of the stage for mounting 32, there is mounted a camera 25 for taking image information that is directed upwardly. A printed circuit board 33 or the like on which the work piece 9 is to be mounted is set on the upper surface of the stage for mounting 32.

In the mounting machine 1 having the above-described structure, a work piece 9 attached on the adhesive sheet 11 is sucked and held by the suction collet 7 and conveyed to the temporal placement stage 47 so as to be placed on the stage 47. Then the work piece 9 is sucked and held by the suction collet for mounting 31 and mounted on the printed circuit board 33.

Next, the suction collet 7 of the pickup unit 61 will be described in detail.

Figure 2:
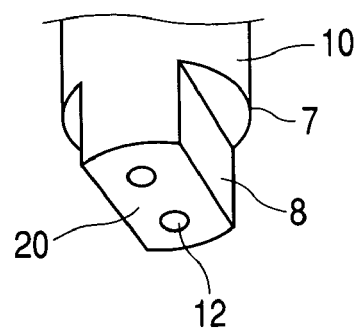
FIG. 2 is a partial perspective view showing a suction collet.

FIG. 2 is a partial perspective view showing the suction collet 7. The suction collet 7 includes a body portion 10 having a substantially elliptic cross section, a suction portion 8 at the tip end portion of the suction collet 7 having a pair of flat surfaces extending in the axial direction (formed by so-called I cutting) and a suction surface 20 that constitutes the lower end surface. On the suction surface 20, there is provided a pair of suction holes 12 formed substantially on the longitudinal axis of that surface and equidistant from the outer edges along the longitudinal axis.

In connection with the above, the distance between the pair of flat surfaces is designed fitly in such a way that a required number of suction holes 12 with a required diameter that are necessary for generating a prescribed suction force can be provided and that interference with other adjacent work pieces attached on the adhesive sheet 11 can be avoided.

In addition, it is preferable that a surface processing using a metal material such as a titanium or the like be applied on the suction surface 20 in order to enhance abrasion resistance. This is because if the suction surface becomes uneven with many times of repetition of the work piece suction process, a gap is created between the upper surface of the work piece 9 and the suction surface 20 and air leakage will occur to deteriorate suction performance. The aforementioned surface processing is performed in order to avoid such a situation.

The aforementioned elliptic shape of the body portion 10 of the suction collet 7 is merely adopted as a shape that prevents the suction collet 7 from interfering with other work pieces adjacent to the work piece 9 to be sucked, and therefore it may be modified fitly in accordance with the shape and other factors of the work piece 9. Furthermore, the diameter, number and position of the suction holes 12 may be modified fitly in accordance with various factors such as the shape and size of the work piece, the position of suction holes 14 (which will be described later) of the suction member 13 or the shape of the push-up pin 15 so that the work piece can be sucked and held stably.

Figure 3:
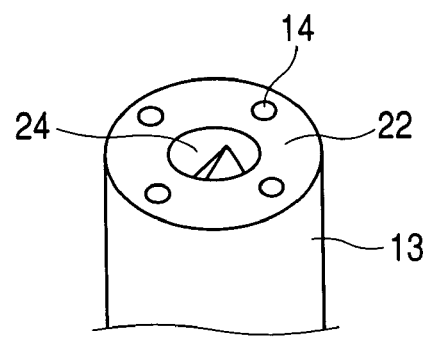
FIG. 3 is a partial perspective view showing the suction collet under the state in which a push-up pin is retracted.
Figure 4:
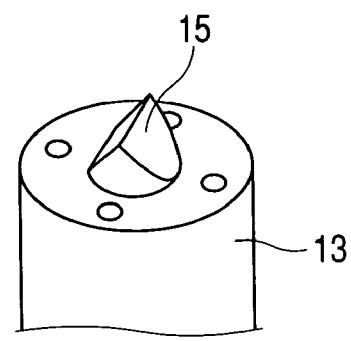
FIG. 4 is a partial perspective view showing the suction collet under the state in which a push-up pin is pushed out.

FIGS. 3 and 4 are perspective views showing the suction member 13. FIG. 3 shows a state in which the push-up pin 15 is retracted from the suction surface, and FIG. 4 shows a state in which the push-up pin 15 is projecting beyond the suction surface.

The suction member 13 is of the substantially cylindrical shape. On the suction surface 22 that constitutes the upper surface of the suction member 13, there is provided suction holes 14 arranged circumferentially with equal spacing. Each suction hole 14 is in communication with a vacuum pump (not shown) for enabling suction of the adhesive sheet. At the substantially central area on the suction surface 22, there is provided a through-bore 24, in which a push-up pin 15 is received in such a way as to be slid able in the up and down direction. One end of the push-up pin 15 is tapered down and the other end is connected to a driving portion that is not shown in the drawings. Thus, the push-up pin 15 can be moved up and down for the pushing-up operation. The driving portion may be constructed by using, for example, a hydraulic mechanism, a cylinder mechanism or a cam mechanism. FIG. 4 shows a state in which the push-up pin 15 is pushed up by the driving portion.

In this embodiment of the present invention, four suction holes 14 are provided on the suction member 13 and the adhesive sheet 11 is sucked at four positions so that detachment or displacement of the adhesive sheet 11 is avoided upon suction of the work piece 9 by the suction collet 7. However, the diameter, number and position of the suction holes 14 may be modified fitly as long as detachment and displacement of the adhesive sheet 11 can be prevented from occurring.

Figure 5:
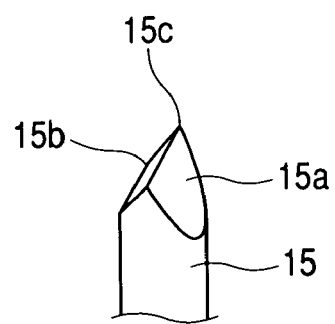
FIG. 5 is a partial perspective view showing the push-up pin.

FIG. 5 is a partial perspective view showing the push-up pin 15. The tip end portion of the push-up pin 15 is defined by tapered surfaces 15a and 15b with substantially equal inclination relative to the axial direction and a linear portion 15c that connects the tapered surfaces. Therefore, the push-up pin 15 is in contact with the adhesive sheet 11 by a substantially linear area at the linear portion 15c.

Figure 10:
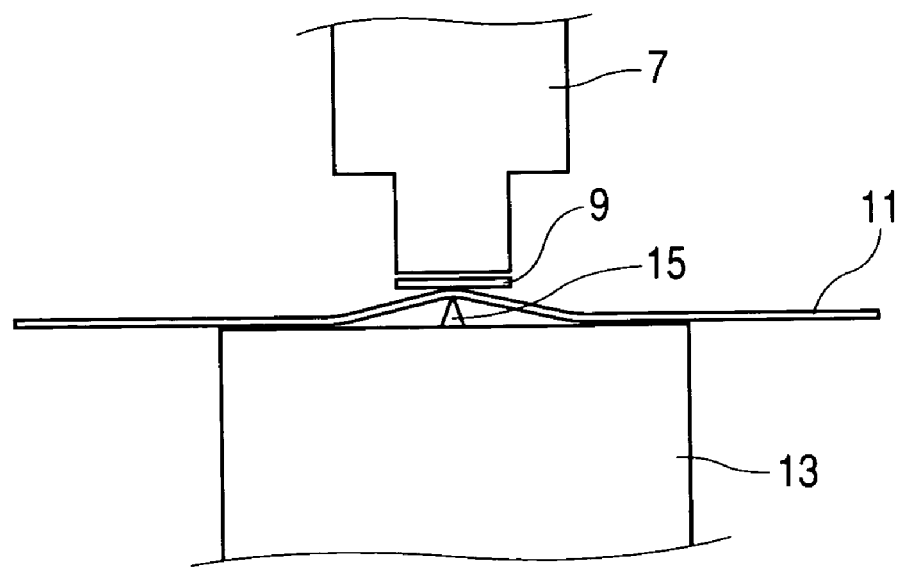
FIG. 10 is a view showing the state same as in FIG. 9 but seen from a direction orthogonal to the direction in FIG. 9.
Figure 11:
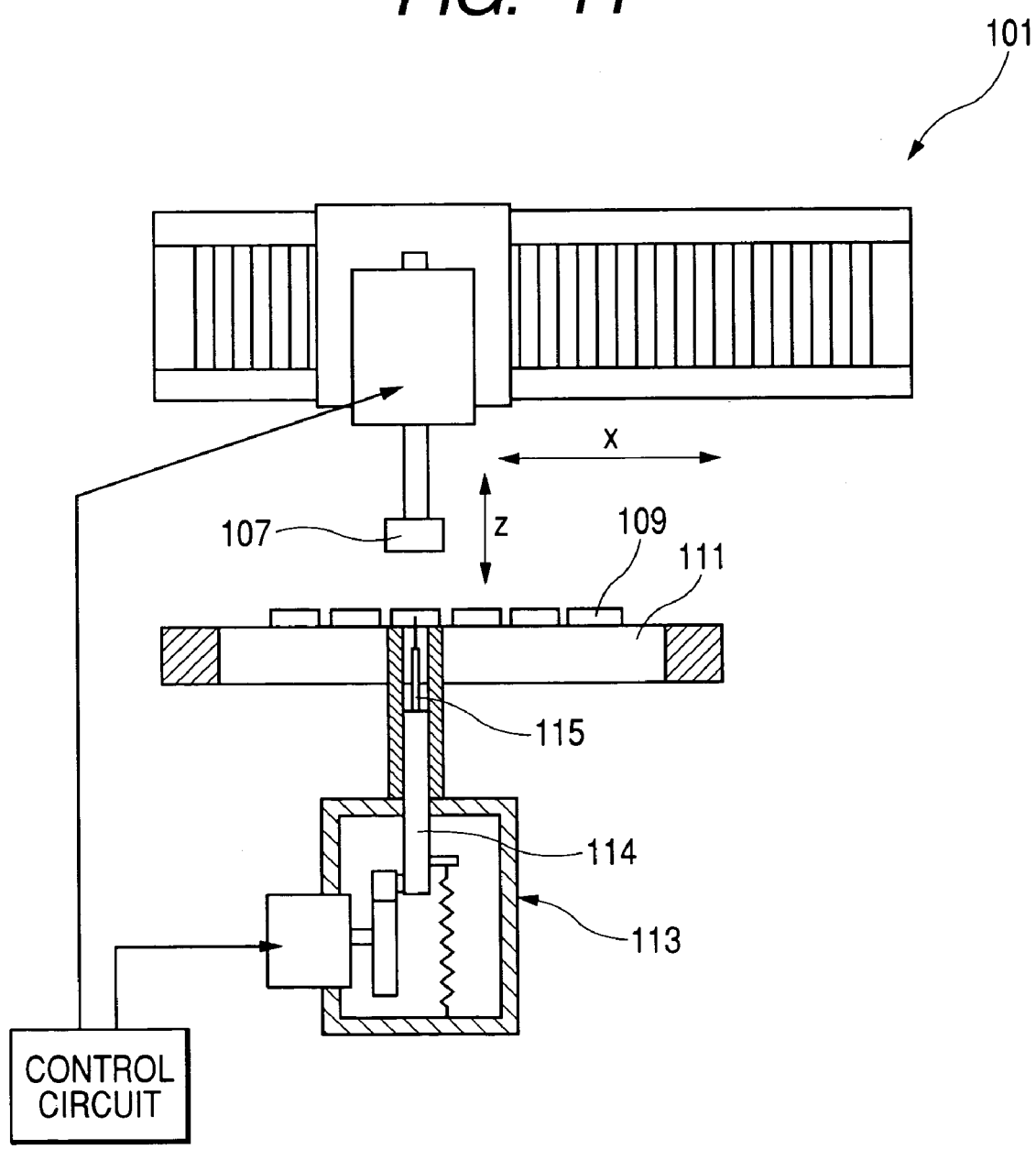
FIG. 11 is a front view showing a pickup apparatus according to a prior art.

The push-up pin 15 is disposed in such a way that under the pushed up state, the linear portion 15c is aligned with the line connecting the two suction holes provided on the suction collet 7 (see FIG. 10). With this feature, the distance from the suction holes 12 of the suction collet 7 to the sucked portions of the work piece 9 can be made always constant. For example, even if the work piece 9 is inclined from the horizontal direction under the state in which the work piece 9 is pushed up by the push-up pin 15, the distance from the portions on the surface of the work piece 9 corresponding to the position at which the work piece 9 is pushed up by the push-up pin 15 to the suction holes 12 of the suction collet 7 can be made always constant.

It is preferable that the ratio of the length of an object to be sucked and the length of the linear portion 15c corresponding to the longitudinal direction of that object be within the range of 3-to-1 to 2-to-1. If the ratio is larger than 2-to-1 (that is, if the length of the linear portion 15c is relatively long), the contact area of the work piece 9 and the adhesive sheet 11 is increased and detachment of the work piece 9 becomes difficult. If the ratio is smaller than 3-to-1 (that is, if the length of the linear portion 15c is relatively short), stability of the work piece 9 in the longitudinal direction cannot be achieved and it is difficult to provide the aforementioned predetermined space between the work piece 9 and the suction collet 7.

In addition, it is preferable that the shape of the linear portion 15c be a flat surface or a curved surface with the radius of curvature equal to or larger than 0.2 mm. If the top portion of the linear portion 15c is like a blade, there is the risk that it can break the adhesive sheet 11. Therefore, the radius of curvature of the linear portion 15c should be determined appropriately taking into consideration the thickness of the adhesive sheet 11, the suction force or other factors.

In the following, the operation of the mounting machine having the above-described structure will be described.

Figure 6:
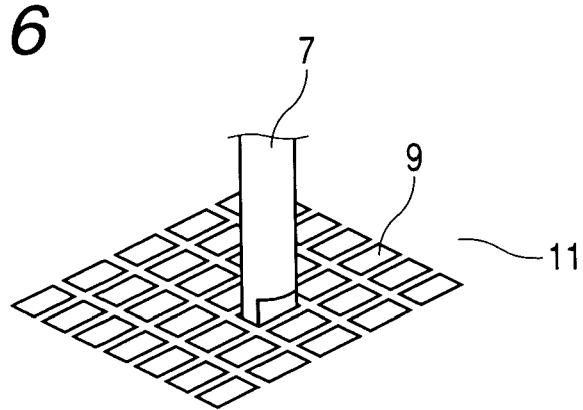
FIG. 6 is a perspective view showing the state in which the suction collet has been lowered to a work piece.
Figure 7:
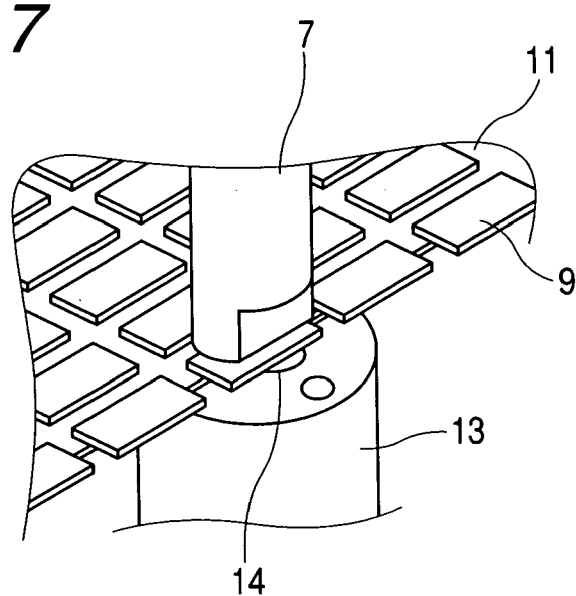
FIG. 7 is a cutaway view showing the state same as in FIG. 6.
Figure 8:
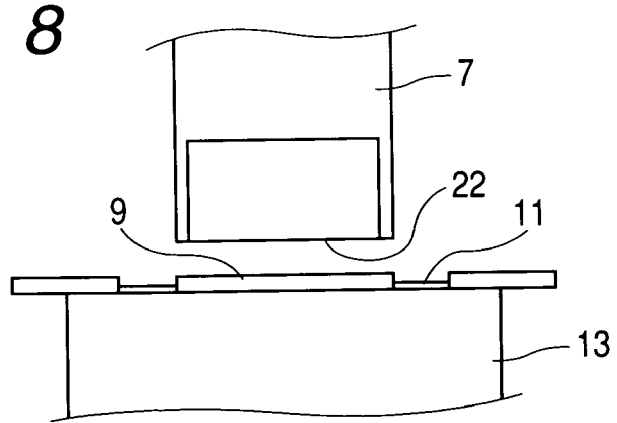
FIG. 8 is a front view of the state same as in FIG. 7.

FIGS. 6 to 8 show the principal portion of the structure according to the present invention under the state in which the suction collet 7 has been lowered relative to the work piece 9. FIG. 6 is a perspective view showing this structure, FIG. 7 is a cutaway view showing the positional relationship of the suction collet 7, the work piece 9 and the suction member 13, and FIG. 8 is a front view.

In the process in which the work piece 9 is held by suction and transferred by the pickup apparatus 3, the suction collet 7 is first moved to a position above a prescribed work piece 9 arranged on the adhesive sheet 11 as shown in FIG. 6 at which the suction collet 7 is kept away from the work piece 9 by a predetermined distance.

On the other hand, the suction member 13 is moved to a position at which it is in contact with the portion of the lower surface of the adhesive sheet 11 on which the prescribed work piece is adhered (see FIG. 7).

Under this state, the suction collet 7 for sucking the work piece 9 and the suction member 13 are in such a positional relationship in which their axes are aligned with each other. The gap between the upper surface of the work piece 9 and the suction surface 22 of the suction collet 7 is approximately 200 μm (see FIG. 8).

Then, the vacuum pump is activated so that the suction member 13 sucks the lower surface of the adhesive sheet 11 to secure the adhesive sheet 11.

Furthermore, the push-up pin 15 is pushed up in such a way that the work piece 9 is opposed to the suction surface 20 of the suction collet 7 with a predetermined gap there between. This state is shown in FIGS. 9 and 10.

Figure 9:
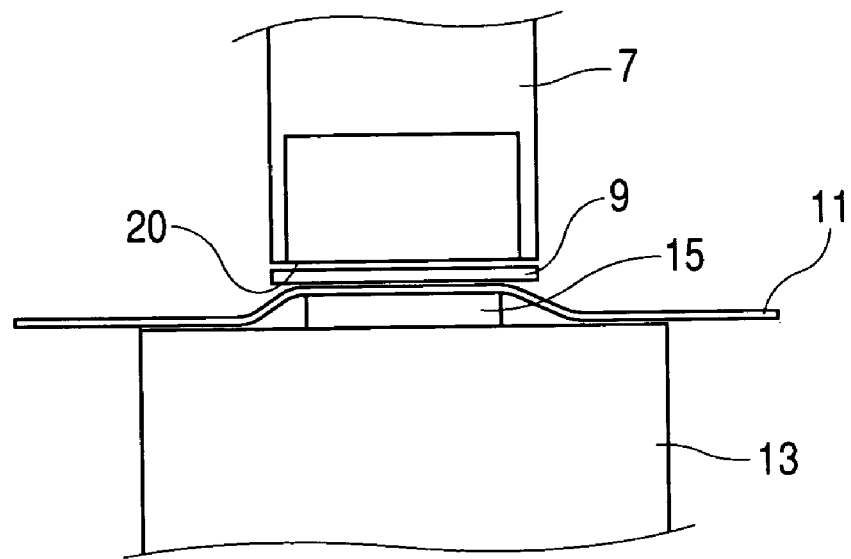
FIG. 9 shows a state in which the push-up pin is pushed out.

FIG. 9 is a front view, and FIG. 10 is a view showing the state same as in FIG. 9 but seen from a direction orthogonal to the direction in FIG. 9. As shown in these drawings, the linear portion 15c of the push-up pin 15 is opposed to the suction holes of the suction collet 7 with respect to the work piece 9. The lower surface of the work piece 9 is detached from the adhesive surface of the adhesive sheet 11 except for the area of the lower surface of the work piece that is pushed up by the push-up pin 15 without piercing the adhesive 11.

In this embodiment, the distance in the vertical direction between the upper surface of the work piece 9 that is opposite to the portion at which the push-up pin abuts the work piece 9 via the adhesive sheet 11 and the line connecting the two suction holes of the suction collet 7 (i.e. the distance between the surface of the work piece 9 that faces the suction collet 7 and the suction surface 20 of the suction collet 7) is approximately 30 μm. This distance may be adjusted in accordance with the suction force of the suction collet 7, namely, there may be provided such a gap with which a suction force that can suck the work piece 9 that has a certain shape, size and mass is achieved.

Next, a vacuum pump (not shown) in communication with the suction holes 12 of the suction collet 7 is activated so that the work piece 9 is sucked. More specifically, the suction collet 7 sucks the work piece 9 only by a suction force while a gap remains between the suction collet 7 and the work piece 9.

The suction collet 7 that sucks and holds the work piece 9 is moved by the driving means, and when it reaches a position above the temporal placement stage 47, the vacuum pump is deactivated to place the work piece 9 on the temporal placement stage 47 (see FIG. 1).

After that, the suction collet for mounting 34 is moved to the temporal placement stage 47 to suck and hold the work piece 9.

Furthermore, the suction collet for mounting 34 is moved to a position above the object of mounting 33 such as a printed circuit board on the mounting stage 32 on which an adhesive or a cream solder or the like has been applied in advance. Then, the suction collet for mounting 34 is lowered, and after it reaches a predetermined position relative to the object of mounting 33, the vacuum pump is deactivated to release the suction force. Thus, mounting is completed.

In the above-described embodiment of the present invention, the structure in which the push-up pin 15 is moved upward to push the work piece 9 up is adopted. However, the structure of the apparatus may be modified in such a way that the suction member 13 is moved up to a predetermined position under the state in which the tip end of the push-up pin 15 is substantially coplanar with the suction surface of the suction member 13 while sucking the back surface of the adhesive sheet 11, the suction collet 7 is lowered until it is stopped at a position at which a distance between the suction surface 20 of the suction collet 7 and the upper surface of the work piece 9 is approximately 30 μm, then only the suction member 13 is lowered leaving the push-up pin 15, and after that the work piece 9 is sucked by the suction collet 7.

Although the mounting machine 1 has the suction collet 7 for picking up the work piece 9 and the suction collet for mounting 31 as separate units, it is apparent that the machine may be modified in such a way that the mounting operation also is carried out by the suction collet 7 for picking up the work piece 9. In that case, the linear guide rails 35 and 36 will be modified into one single member (i.e. a linear guide rail having such a length that allows the suction collet 7 to reciprocate between the work pickup site and the mounting site).

Individual driving means for moving the suction collet 7, the suction member 13, the suction collet for mounting 34 in the x, y and z directions in this embodiment of the present invention may be various means such as motors or cylinders etc.

The present invention may be embodied in various forms without departing from the essential features of the invention. Therefore, is should be understood that the description of the above embodiment is for explanatory purpose only, and it is not intended to limit the present invention.

The present invention can be applied not only to a method and an apparatus for picking up a semiconductor chip but also a method and an apparatus for picking up an article having a small thickness.

What is claimed is:

1. A pickup apparatus for detaching a work piece attached on an adhesive sheet from said adhesive sheet and transferring it, comprising:
    a suction member disposed below said adhesive sheet for sucking and holding said adhesive sheet, said suction member being movable up and down;
    push-up means for peeling said work piece partially from said adhesive sheet by pressing said work piece through said adhesive sheet without piercing through the adhesive sheet, the push-up means having a linear portion defined by two planar sides joined at an apex and configured to press a linear area of said work piece; and
    a suction collet having a plurality of suction holes and disposed above said work piece for sucking and holding said work piece, said suction collet being movable up and down,
    wherein under states where said suction member sucks to hold a lower surface of the adhesive sheet, where said work piece is pressed and partially peeled from said adhesive sheet by said push-up means, where said work piece is supported through the adhesive sheet by said push-up means without piercing through the adhesive sheet, where a line extending between the plurality of suction holes of said suction collet is aligned with and opposed to the linear portion of said push-up means in a suction direction, and where said suction collet and said work piece are spaced from each other, vacuum force is applied to said work piece to completely detach said work piece from said adhesive sheet only by vacuum force without sandwiching said work piece by said suction collet and said push-up means.

2. A pickup apparatus according to claim 1, wherein said push-up means is movable up and down independently from said suction member, and said suction member is placed at a position lower than the push-up means so as to partially peel said work piece from said adhesive sheet.

3. A mounting machine comprising:
    a pickup apparatus according to claim 2; and
    a mounting apparatus for mounting the work piece detached by the pickup apparatus on an object for mounting.

4. The mounting machine according to claim 3, wherein a length of the work piece to be sucked and a length of the linear portion corresponding to the longitudinal direction of the work piece is within the range of 3:1 to 2:1.

5. A mounting machine comprising:
    a pickup apparatus according to claim 1; and
    a mounting apparatus for mounting the work piece detached by the pickup apparatus on an object for mounting.

6. The mounting machine according to claim 5, wherein a length of the work piece to be sucked and a length of the linear portion corresponding to the longitudinal direction of the work piece is within the range of 3:1 to 2:1.

7. The pickup apparatus according to claim 1, wherein a length of the work piece to be sucked and a length of the linear portion corresponding to the longitudinal direction of the work piece is within the range of 3:1 to 2:1.

8. A pickup apparatus for detaching a work piece attached on an adhesive sheet from said adhesive sheet and transferring it, comprising:
    a suction member disposed below said adhesive sheet for sucking and holding said adhesive sheet, said suction member being movable up and down;
    push-up means for peeling said work piece partially from said adhesive sheet by pressing said work piece through said adhesive sheet without piercing through the adhesive sheet, the push-up means being movable up and down independently from said suction member and being received in said suction member, the push-up means having a linear portion defined by two planar sides joined at an apex and configured to press a linear area of said work piece; and
    a suction collet having a plurality of suction holes and disposed above said work piece for sucking and holding said work piece, said suction collet being movable up and down,
    wherein under states where said suction member sucks to hold a lower surface of the adhesive sheet, where said work piece is pressed and partially peeled from said adhesive sheet by said push-up means, where said work piece is supported through the adhesive sheet by said push-up means without piercing through the adhesive sheet, where a line connecting the plurality of suction holes of said suction collet is aligned with and opposed to the linear portion of said push-up means in a suction direction, and where said suction collet and said work piece are spaced from each other, vacuum force is applied to said work piece to completely detach said work piece from said adhesive sheet only by vacuum force without sandwiching said work piece by said suction collet and said push-up means.

9. A mounting machine comprising:

a pickup apparatus according to claim 8; and a mounting apparatus for mounting the work piece detached by the pickup apparatus on an object for mounting.

10. The mounting machine according to claim 9, wherein a length of the work piece to be sucked and a length of the linear portion corresponding to the longitudinal direction of the work piece is within the range of 3:1 to 2:1.

11. The pickup apparatus according to claim 8, wherein a length of the work piece to be sucked and a length of the linear portion corresponding to the longitudinal direction of the work piece is within the range of 3:1 to 2:1.

12. A work piece pickup method for sucking and holding a work piece attached on an adhesive sheet by means of a suction collet, having a plurality of suction holes, that is disposed above said work piece attached on said adhesive sheet in such a way as to be movable up and down for sucking and holding said work piece, a suction member movable up and down for sucking and holding said adhesive sheet and disposed below said adhesive sheet, and push-up means movable up and down independently from said suction member and having a linear portion defined by two planar sides joined at an apex and configured to press a linear area of said work piece, so as to detach and transfer said work piece, comprising:

a sheet suction process for sucking and holding a lower surface of said adhesive sheet corresponding to said work piece by said suction member;

a process of pressing and partially peeling said work piece by said push-up means from said adhesive sheet held by said suction member without piercing through the adhesive sheet;

a supporting process for supporting the partially peeled work piece through the adhesive sheet by said push-up means without piercing through the adhesive sheet, the push-up means being disposed in a manner such that a line connecting the plurality of suction holes of said suction collet is aligned with and opposed to the linear portion of said push-up means in a suction direction; and while maintaining said supporting process, a work piece suction process for sucking and holding said work piece by applying vacuum force from said suction collet to said work piece in a positional relation that said suction collet and said work piece which is partially peeled from said adhesive sheet are spaced from each other to completely detach said work piece from said adhesive sheet only by vacuum force and without sandwiching said work piece by said suction collet and said push-up means.

13. The method according to claim 12, wherein a length of the work piece to be sucked and a length of the linear portion corresponding to the longitudinal direction of the work piece is within the range of 3:1 to 2:1.

\* \* \* \* \*